(12) United States Patent
Regev et al.

(10) Patent No.: US 11,303,321 B2
(45) Date of Patent: Apr. 12, 2022

(54) RADIO FREQUENCY FRONT END FOR A FULL DUPLEX OR HALF DUPLEX TRANSCEIVER

(71) Applicant: Huawei Technologies Co., Ltd., Shenzhen (CN)

(72) Inventors: Dror Regev, Munich (DE); Doron Ezri, Munich (DE); Shimon Shilo, Munich (DE)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 17/172,715

(22) Filed: Feb. 10, 2021

(65) Prior Publication Data
US 2021/0167810 A1 Jun. 3, 2021

Related U.S. Application Data

(63) Continuation of application No. PCT/EP2018/072174, filed on Aug. 16, 2018.

(51) Int. Cl.
*H04B 1/7107* (2011.01)
*H04B 1/04* (2006.01)
*H04L 5/14* (2006.01)

(52) U.S. Cl.
CPC ....... *H04B 1/71075* (2013.01); *H04B 1/0458* (2013.01); *H04B 1/0483* (2013.01); *H04L 5/14* (2013.01); *H04B 2001/0408* (2013.01)

(58) Field of Classification Search
CPC .... H04B 1/005; H04B 1/0053; H04B 1/0067; H04B 1/0075; H04B 1/0458; H04B 1/38;
(Continued)

(56) References Cited

U.S. PATENT DOCUMENTS 6,711,392 B1  3/2004  Gillis
7,542,740 B1 * 6/2009  Granger-Jones ..... H04B 1/0483
                                                340/584
(Continued)

FOREIGN PATENT DOCUMENTS

CN   101034877 A   9/2007
CN   101667853 A   3/2010
(Continued)

OTHER PUBLICATIONS

Regev, D., et al., "Modified re-configurable quadrature balanced power amplifiers for half and full duplex RF front ends," 2018 Texas Symposium on Wireless and Microwave Circuits and Systems (WMCS), Apr. 5-6, 2018, 4 pages.
(Continued)

*Primary Examiner* — Young T. Tse
(74) *Attorney, Agent, or Firm* — Conley Rose, P.C.

(57) ABSTRACT

A radio frequency (RF) front end for wireless communications, in particular for use in a half duplex (HD) and/or full duplex (FD) transceiver. The RF front end is based on a quadrature balanced power amplifier (QBPA). The RF front end includes an antenna port for outputting a transmit signal to and receiving a receive signal from an antenna, and a receive port for outputting the receive signal to a signal processing section. Further, the QBPA is configured to receive a transmit input signal at a first port, receive a cancellation input signal at a fourth port, and receive the receive signal at a second port coupled to the antenna port.

20 Claims, 8 Drawing Sheets

(58) Field of Classification Search
CPC . H04B 1/40; H04B 1/405; H04B 1/50; H04B 1/52; H04B 1/525; H04B 1/71075; H04B 1/711; H04B 2001/0408; H04L 5/14
USPC ............... 375/144, 148, 219, 222, 257, 260, 375/279–281, 285, 297, 308; 370/276, 370/278; 455/73, 84, 114.3
See application file for complete search history.

(56) References Cited

U.S. PATENT DOCUMENTS

| | | | |
|---|---|---|---|
| 2007/0115053 A1* | 5/2007 | Vaisanen | H03F 3/24 330/124 R |
| 2010/0304701 A1 | 12/2010 | Jung et al. | |
| 2011/0053525 A1 | 3/2011 | Yi | |
| 2011/0143821 A1 | 6/2011 | Hwang et al. | |
| 2012/0182906 A1* | 7/2012 | Knox | H04B 1/44 370/278 |
| 2013/0176912 A1 | 7/2013 | Khlat | |
| 2015/0163044 A1 | 6/2015 | Analui et al. | |
| 2015/0222300 A1* | 8/2015 | Schmidhammer | H04L 5/14 370/278 |
| 2016/0087823 A1* | 3/2016 | Wang | H04L 25/0272 375/257 |
| 2016/0337051 A1 | 11/2016 | Shahramian et al. | |
| 2017/0070251 A1* | 3/2017 | Floyd | H03H 7/463 |
| 2017/0317711 A1 | 11/2017 | Jian et al. | |

FOREIGN PATENT DOCUMENTS

| | | | |
|---|---|---|---|
| CN | 108111186 A | 6/2018 | |
| EP | 2146438 A1 | 7/2008 | |
| JP | 2011055457 A | 3/2011 | |
| WO | WO-2019081018 A1 * | 5/2019 | ............... H03F 3/24 |
| WO | 2019149362 A1 | 8/2019 | |

OTHER PUBLICATIONS

Yu-Liang, G., et al, "A New Generation of S Band Active Phased Array Radar T/R Module," Modern Radar, Jan. 2010, 4 pages.

* cited by examiner

RADIO FREQUENCY FRONT END FOR A FULL DUPLEX OR HALF DUPLEX TRANSCEIVER

CROSS-REFERENCE TO RELATED APPLICATIONS

This application is a continuation of International Patent Application No. PCT/JP2018/072174 filed on Aug. 16, 2018, which is hereby incorporated by reference in its entirety.

TECHNICAL FIELD

The present disclosure relates to a radio frequency (RF) front end for wireless communications, in particular for use in a half duplex (HD) and/or full duplex (FD) transceiver. Accordingly, the disclosure also relates to a transceiver with a dual mode RF front end. The RF front end of the disclosure is especially based on a quadrature balanced power amplifier (QBPA).

BACKGROUND

There are many single transmit and receive (T/R) antenna wireless communication scenarios, in which an FD transceiver with an FD optimized RF front end performs better than a common HD transceiver. In order to enable both a transmit mode and a receive mode, an FD optimized RF front end typically employs a circulator, while a HD RF front end typically employs a T/R switch.

Figure 6A:
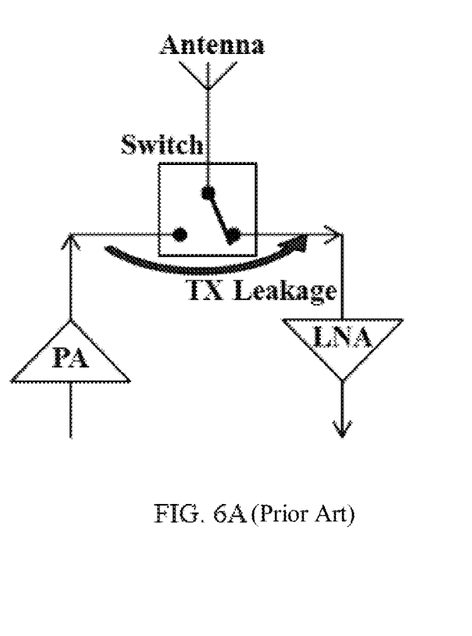
FIG. 6A is an HD employing a T/R switch.

FIG. 6A shows conceptually an example of a T/R switched HD RF front end, as it is common in wireless communication applications. A transmit signal leakage (TX leakage) through the switch should be low in this HD RF front end such that the durability of a low-noise amplifier (LNA) in the receive path is not compromised. Notably, a performance degradation in the LNA is affordable, since the receiver is turned off during transmit periods. The T/R switch must withstand the full transmit power, and hence needs to employ high-power switching devices that introduce significant insertion loss. T/R switch losses typically increase with frequency, while isolation degrades with frequency.

Figure 6B:
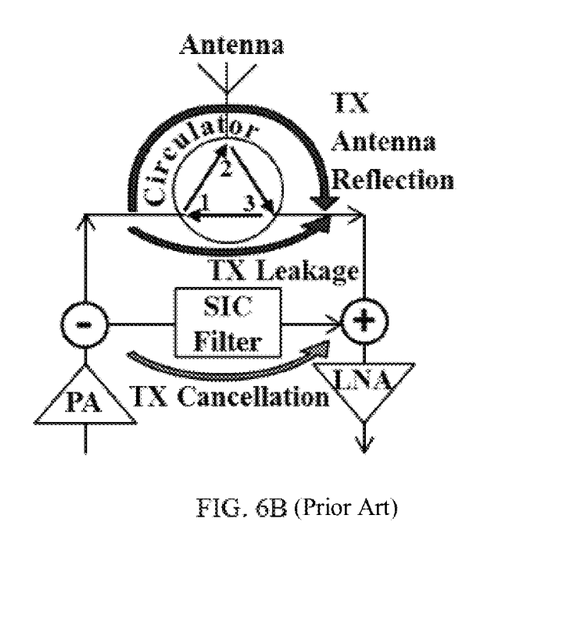
FIG. 6B is an FD employing a circulator for initial T/R isolation and a SIC filter branch that further cancels circulator leakages and antenna reflections.

FIG. 6B shows conceptually an example of a circulator switched FD RF front end. The circulator is employed as a primary high-power T/R isolation stage. However, its isolation is limited and cannot ensure sufficient LNA protection. Moreover, the circulator tends to be bulky and expensive. Additional issues arise due to linear and low-noise FD operation. A self-interference cancellation (SIC) filter is typically used to further suppress TX interference resulting from limited circulator isolation, i.e. TX leakage, and TX signal antenna reflections. The input to the SIC filter is a TX signal copy tapped from the main TX channel (−), and the cancellation signal (TX cancellation) is injected into the receive channel (+). The SIC filter, however, adds complexity to the design of the FD transceivers. It also adds a transmit loss, since sufficient power needs to be tapped from the transmit signal, as well as receive loss caused by the network used to combine/subtract the signal arriving from the SIC filter.

In view of the above disadvantages, it is highly desirable to design an FD-suitable RF front end isolation stage, which eliminates the need for a circulator and provides even higher isolation over a wider frequency band for, particularly in the presence of TX antenna reflections. Attributes of a good RF front end isolation stage would in particular be as follows.

Good T/R isolation.

Wide-band isolation performance to enable high bandwidth (BW) signal transmissions.

Adequate TX power handling.

Low insertion loss on both TX and receive (RX) paths.

Furthermore, it is particularly desirable to design a dual mode FD/HD RF front end, which can be used both in FD mode and HD mode. However, as of today no such dual mode RF front end is available.

Figure 7:
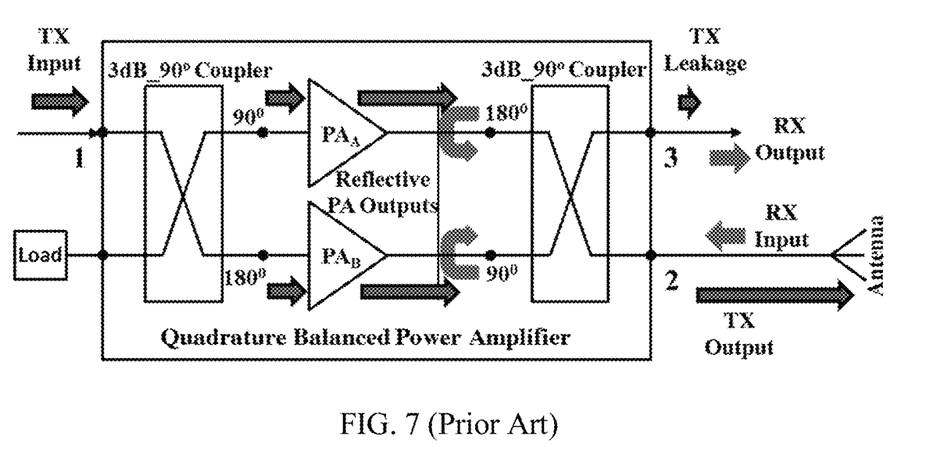
FIG. 7 shows a known circulator-free dual mode RF front end.

FIG. 7 shows a first proposal for a circulator-free dual mode RF front end, as presented in 'D. Regev et al. "*Modified re-configurable quadrature balanced power amplifiers for half and full duplex RF front ends*" 2018 Texas Symposium on Wireless and Microwave Circuits and Systems (WMCS), Waco, T X, 2018, pp. 1-4.' This proposal bases on a QBPA with reflective power amplifier (PA) outputs to perform simultaneous transmit receive (STR).

In particular, this proposal employs two power amplifying paths nestled within input and output quadrature power dividers (3 decibel (dB) 90° couplers). The transmit input into the circuit drives port 1, whereas the transmit output into the antenna exits via port 2. This configuration yields good matching at all ports, including port 2, regardless of the internal reflection coefficients of $PA_A$ and $PA_B$, provided these are at least similar. An RX signal arriving at port 2 from the antenna will be divided at the output coupler into the two PA outputs, and may be reflected and reconstructed at port 3.

A transmit signal path performance for the RF front end shown in FIG. 7 is comparable to a QBPA performance without the extra losses, which a T/R switch or a circulator introduces. Thus, it can yield transmit power efficiency higher than an RF front end with a switch or a circulator (as shown in FIG. 6A or 6B). The BW of the RF front end topology is highly related to the BW of the quadrature dividers employed, whereas wide-band quadrature divider designs can be supported over different topologies and technologies.

T/R isolation of the RF front end of FIG. 7 can be sufficient to protect the LNA in HD mode for a non-reflective antenna. However, the magnitude of a practical antenna reflection of the transmitted signal will dominate isolation degradation. The antenna reflection isolation degradation is a result of the reflected TX signal reconstruction at port 3 of the receiver.

Figure 8:
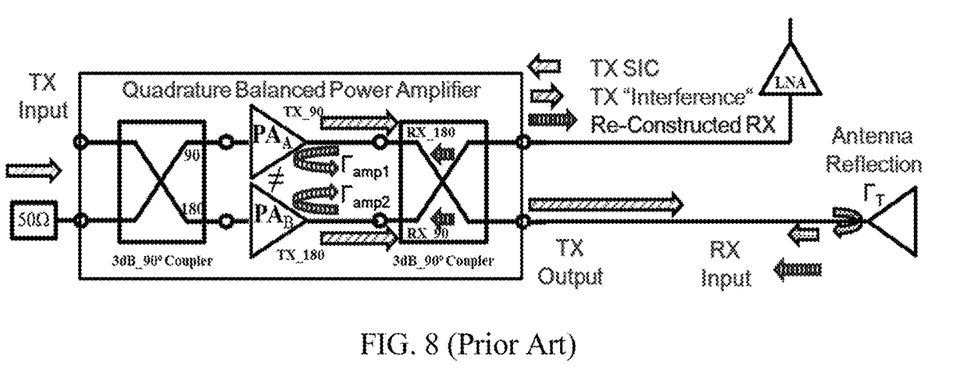
FIG. 8 shows another known circulator-free dual mode RF front end.

FIG. 8 thus shows a second proposal covered by the same paper for a circulator-free dual mode RF front end. This second proposal bases on a modified QBPA with un-equal transmit paths (unequal $PA_A$ and $PA_B$). This modification enables the flexibility to create a feed-forward TX cancellation signal into the receive path with the right amplitude and anti-phase to the TX signal reflected from the antenna. Hence, the second proposal realizes a dual mode RF front end with a built-in SIC capability in order to increase the isolation between transmit and receive ports.

However, the second proposal requires control of both amplitude and phase of the two PA paths of $PA_A$ and $PA_B$, which adds considerable complexity to the front end design. Further, the second proposal is limited in isolation of a wide-band signal, but the use of such a wide-band signal is of high interest.

SUMMARY

In view of the above-mentioned challenges and disadvantages, the present disclosure aims to provide an improved dual mode RF front end. The present disclosure has the objective to design a dual mode RF front end with low complexity and good T/R isolation properties, in particular for a wide-band signal and in the presence of TX antenna reflections. The dual mode RF front end of the disclosure should be easy to integrate, e.g. on a chip and/or PCB, and should be simple to implement into an FD or HD transceiver.

The objective of the present disclosure is achieved by the solution provided in the enclosed independent claims. Advantageous implementations of the present disclosure is further defined in the dependent claims.

In particular the present disclosure proposes taking advantage of the QBPA structure with two identical transmit paths. Further, the disclosure proposes injecting a feed forward cancellation signal into a port, which was previously unused after normalizing by the gain of the two equal paths.

A first aspect of the disclosure provides an RF front end for wireless communication, comprising an antenna port for outputting a transmit signal to and receiving a receive signal from an antenna, a receive port for outputting the receive signal to a signal processing section, and a QBPA configured to receive a transmit input signal at a first port, receive a cancellation input signal at a fourth port, receive the receive signal at a second port connected to the antenna port, generate the transmit signal from the transmit input signal and output the transmit signal at the second port, generate a cancellation signal from the cancellation input signal and output the cancellation signal and the receive signal at a third port connected to the receive port.

The injected cancellation input signal reconstructs as the cancellation signal at the third port, and can thus cancel any leakage signals caused at the third port when operating in transmit mode (TX leakage). In particular, the cancellation signal can cancel the transmit signal reflected from the antenna (TX antenna reflections). The four-port RF front end of the first aspect enables dual mode operation without using a circulator or a switch, and particularly has very good wide-band capability for the cancellation of transmit signal reflections from the antenna. Particular advantages of the RF front end of the first aspect is as follows.

It is a dual mode RF front end, i.e. it can be used in an HD or FD mode. Accordingly, it is suitable for a HD or FD transceiver.

It is of low complexity and can be easily integrated on chip.

It is able to provide wide-band cancellation in the presence of antenna reflections, i.e. it shows improved isolation properties.

It is easy to implement, e.g. into a transceiver.

In an implementation form of the first aspect, the cancellation input signal is designed such that the cancellation signal cancels a leakage signal caused at the third port when the transmit signal is output from the second port, and particularly cancels a reflection leakage signal caused at the third port by a reflection in part of the transmit signal output from the second port, which reflection in part is received at the second port.

Accordingly, the T/R isolation properties of the RF front end of the first aspect are high. Further, by adjusting the cancellation input signal, the T/R isolation can be adapted to different leakage mechanisms. Thus, the RF front end of the first aspect offers a large flexibility.

In a further implementation form of the first aspect, the QBPA is configured to amplify a first part of the transmit input signal and a first part of the cancellation input signal, respectively, in a first signal path, and amplify a second part of the transmit input signal and a second part of the cancellation input signal, respectively, in a second signal path, and generate the transmit signal from the first and second transmit input signal parts, and generate the cancellation signal from the first and second cancellation input signal parts.

In a further implementation form of the first aspect, the first signal path is equal to the second signal path and/or the amplification of the first parts is equal to the amplification of the second parts.

The first signal path being equal to the second signal path means that their design is equal, particularly that of the PAs in the different paths. The design situation is thus as in the RF front end shown in FIG. 7, and contrary to the RF front end shown in FIG. 8. A signal transmitted through one path will experience the same amplification (in the PA) than a signal transmitted through the other path.

In a further implementation form of the first aspect, the QBPA further includes a first amplifier arranged in the first signal path for amplifying the first parts, and a second amplifier arranged in the second signal path for amplifying the second parts.

As mentioned above, the amplification by the first amplifier is the same as the amplification by the second amplifier.

In a further implementation form of the first aspect, the first amplifier and the second amplifier are designed to have a high output reflection coefficient.

Thus, a receive signal coming from the antenna can be reflected at either amplifier nearly perfectly, in order to be conveyed to the signal processing section. As a consequence, losses are very low.

In a further implementation form of the first aspect, the QBPA includes a first coupler configured to divide the transmit input signal and the cancellation input signal, respectively, into the first parts and second parts, with a phase difference of 90° between the first parts and the second parts.

In a further implementation form of the first aspect, the QBPA includes a second coupler configured to combine the amplified first and second transmit input signal parts such that they constructively form the transmit signal at the second port and destructively cancel each other at the third port.

Thus, a transmit signal leakage to the third port (i.e. towards the signal processing section used to process the receive signal) is low or even non-existent (notably not considering antenna reflections of the transmit signal).

In a further implementation form of the first aspect, the second coupler is further configured to combine the amplified first and second cancellation input signal parts such that they constructively form the cancellation signal at the third port and destructively cancel each other at the second port.

The cancellation signal at the third port can cancel any T/R leakage, for instance, reflections of the transmit signal at the antenna, which reconstructs at the third port.

In a further implementation form of the first aspect, the second coupler is further configured to divide the receive signal into a first part and a second part, with a phase difference of 90° between the first part and the second part, and provide the first receive signal part to the first signal path and the second receive signal part to the second signal path.

In a further implementation form of the first aspect, the first amplifier is configured to reflect the first receive signal part, and the second amplifier is configured to reflect the second receive signal part.

In this way, the RF front end can be used as HD or FD RF front end.

In a further implementation form of the first aspect, the second coupler is configured to combine the reflected first and second receive signal parts such that they constructively form the receive signal at the third port and destructively cancel each other at the fourth port.

In a further implementation form of the first aspect, a coupler is a hybrid coupler and/or is integrated on a substrate or semiconductor chip.

Such couplers can be made as highly efficient and easy to integrate.

A second aspect of the disclosure provides a FD or HD transceiver comprising a RF front end according to the first aspect or any of its implementation forms, and a transmit and receive antenna connected to the antenna port of the RF front end.

Accordingly, the transceiver of the second aspect achieves the advantages and effects of the RF front end of the first aspect.

A third aspect of the disclosure provides a method for performing a wireless communication using a RF front end, the method comprising providing a transmit signal to and receiving a receive signal from an antenna via an antenna port of the RF front end, using a QBPA to receive a transmit input signal at a first port, receive a cancellation input signal at a fourth port, receive the receive signal at a second port connected to the antenna port, generate the transmit signal from the transmit input signal and output the transmit signal at the second port, and generate a cancellation signal from the cancellation input signal and output the cancellation signal and the receive signal at a third port, and outputting the receive signal to a signal processing section via a receive port connected to the third port.

In an implementation form of the third aspect, the cancellation input signal is designed such that the cancellation signal cancels a leakage signal caused at the third port when the transmit signal is output from the second port, and particularly cancels a reflection leakage signal caused at the third port by a reflection in part of the transmit signal output from the second port, which reflection in part is received at the second port.

In a further implementation form of the third aspect, the method further comprises using the QBPA to amplify a first part of the transmit input signal and a first part of the cancellation input signal, respectively, in a first signal path, and amplify a second part of the transmit input signal and a second part of the cancellation input signal, respectively, in a second signal path, and generate the transmit signal from the first and second transmit input signal parts, and generate the cancellation signal from the first and second cancellation input signal parts.

In a further implementation form of the third aspect, the first signal path is equal to the second signal path and/or the amplification of the first parts is equal to the amplification of the second parts.

In a further implementation form of the third aspect, the method further comprises using a first amplifier of the QBPA arranged in the first signal path for amplifying the first parts, and using a second amplifier of the QPBA arranged in the second signal path for amplifying the second parts.

In a further implementation form of the third aspect, the method further comprises using a first coupler of the QBPA to divide the transmit input signal and the cancellation input signal, respectively, into the first parts and second parts, with a phase difference of 90° between the first parts and the second parts.

In a further implementation form of the third aspect, the method further comprises using a second coupler of the QBPA to combine the amplified first and second transmit input signal parts such that they constructively form the transmit signal at the second port and destructively cancel each other at the third port.

In a further implementation form of the third aspect, the second coupler combines the amplified first and second cancellation input signal parts such that they constructively form the cancellation signal at the third port and destructively cancel each other at the second port.

In a further implementation form of the third aspect, the second coupler divides the receive signal into a first part and a second part, with a phase difference of 90° between the first part and the second part, and provides the first receive signal part to the first signal path and the second receive signal part to the second signal path.

In a further implementation form of the third aspect, the first amplifier reflects the first receive signal part, and the second amplifier reflects the second receive signal part.

In a further implementation form of the third aspect, the second coupler combines the reflected first and second receive signal parts such that they constructively form the receive signal at the third port and destructively cancel each other at the second port.

With the method of the third aspect and its implementation forms, the advantages and effects of the RF front end of the first aspect and its respective implementation forms are achieved.

It has to be noted that all devices, elements, units and means described in the present application could be implemented in the software or hardware elements or any kind of combination thereof. All steps which are performed by the various entities described in the present application as well as the functionalities described to be performed by the various entities are intended to mean that the respective entity is adapted to or configured to perform the respective steps and functionalities. Even if, in the following description of specific embodiments, a specific functionality or step to be performed by external entities is not reflected in the description of a specific detailed element of that entity which performs that specific step or functionality, it should be clear for a skilled person that these methods and functionalities can be implemented in respective software or hardware elements, or any kind of combination thereof.

BRIEF DESCRIPTION OF DRAWINGS

The above described aspects and implementation forms of the present disclosure will be explained in the following description of specific embodiments in relation to the enclosed drawings, in which

FIG. 6A and FIG. 6B show conceptually transceiver RF front ends with their respective transmit signal leakage into the receiver, in particular for.

DETAILED DESCRIPTION OF EMBODIMENTS

Figure 1:
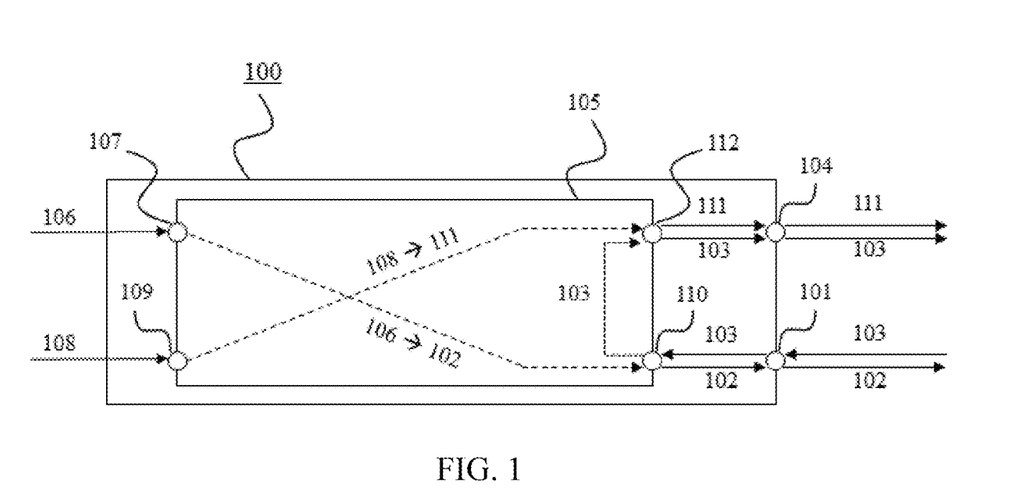
FIG. 1 shows a dual mode RF front end according to an embodiment of the disclosure.

FIG. 1 shows a RF front 100 end according to an embodiment of the disclosure. The RF front end 100 is in particular a dual mode RF front end, which is suitable for FD and HD wireless communications, for instance, in an FD or HD transceiver.

The RF front end 100 has an antenna port 101, to which an antenna 200 (see FIG. 2) can be connected. The antenna port 101 is used to output a transmit signal 102 to the antenna 200 (in a transmit mode), and is used to receive a receive signal 103 from the antenna 200 (in a receive mode), either simultaneously (FD) or not simultaneously (HD).

The RF front end 100 also has a receive port 104, to which a receive path including a signal processing section can be connected. The receive port 104 is used to output the receive signal 103, as received from the antenna 200 via the antenna port 101, to the signal processing section.

The RF front end 100 further has a QBPA 105 with equal signal paths. The QBPA 105 acts as a T/R isolation stage and allows STR. The QBPA 105 includes four ports, namely a first port 107, a second port 110, a third port 112, and a fourth port 109. The second port 110 is connected to the antenna port 101, i.e. it is used to provide the transmit signal 102 to the antenna 200 and to receive the receive signal 103 from the antenna 200. The third port 112 is connected to the receive port 104, i.e. it is used to provide the receive signal 103 to the signal processing section.

The QBPA 105 is in particular configured to receive a transmit input signal at the first port 107, and to receive a cancellation input signal at the fourth port 109. Further, it is configured to receive the receive signal 103 at the second port 110. The QBPA 105 is further configured to generate the transmit signal 102 from the transmit input signal 106 and output it at the second port, to generate a cancellation signal 111 from the cancellation input signal 108 and output it at the third port 112, and to output the receive signal 103 received at the second port 110 at the third port 112.

Accordingly, in a transmit mode, the transmit signal 102 is generated (indicated by the dashed line 106→102) and provided to the antenna 200. Further, the cancellation signal 111 is generated (indicated by the dashed line 108→111) and provided to the signal processing section. The cancellation signal 111 may cancel any leakage caused by the transmit signal 102 output to the antenna 200, e.g. reflections of the transmit signal 102 at the antenna 200, which are reflected back to the antenna port 101/second port 110 or cancel any other imperfections leading to other TX signal "leakage" phenomena between the second port 110 to the third port 112. In a receive mode, the receive signal 103 is conveyed from the second port 110 to the third port 112 (indicated by the dotted line) and provided to the signal processing section. As mentioned above, the transmit mode and receive mode may be set simultaneously.

Figure 2:
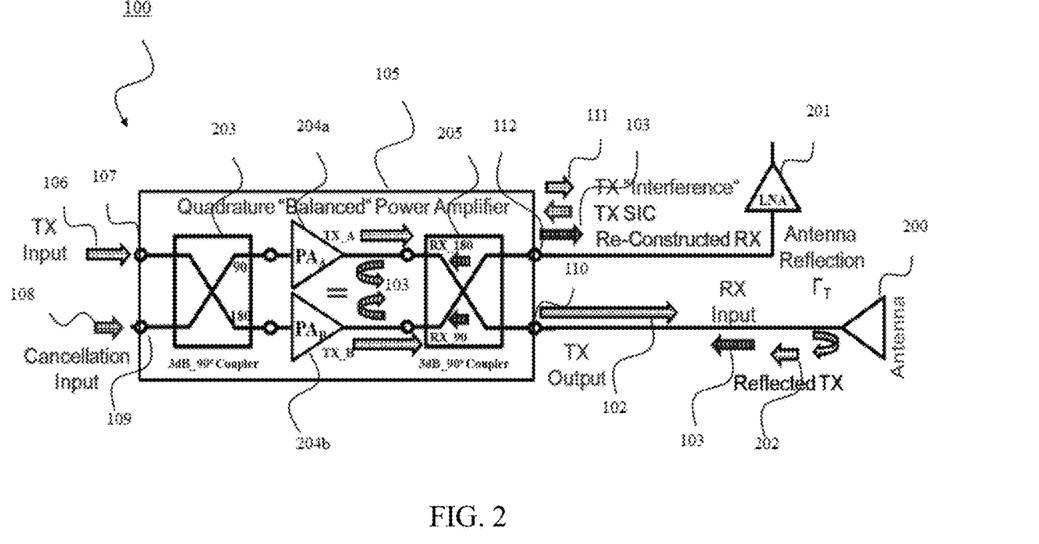
FIG. 2 shows a dual mode RF front end according to an embodiment of the disclosure.

FIG. 2 shows a dual mode RF front end 100 according to an embodiment of the disclosure, which builds on the RF front end 100 shown in FIG. 1. Accordingly, same elements are provided with the same reference signs. FIG. 2 shows in particular how the transmit signal 102 is generated from the transmit input signal 106, how the cancellation signal 111 is generated from the cancellation input signal 108, and how the receive signal 103 is provided from the second port 110 to the third port 112. To this end, the QPBA 105 includes a first coupler 203, a first amplifier 204a, a second amplifier 204b, and a second coupler 205. The first coupler 203, first amplifier 204a and second coupler 205 form at least part of a first signal path, and the first coupler 203, second amplifier 204b, and second coupler 205 form at least part of a second signal path. Accordingly, the first amplifier 204a is arranged in the first signal path, and the second amplifier 204b in the second signal path.

The first coupler 203 is configured to divide the transmit input signal 106 and the cancellation input signal 108, respectively, into first parts and second parts (i.e. two parts for each signal 106 and 108). For each signal 106 and 108, a phase difference of 90° is thereby generated between the first parts and the second parts. The first amplifier 204a is configured to amplify the first parts, and the second amplifier 204b is configured to amplify the second parts. The second coupler 205 is further configured to combine the amplified first and second transmit input signal parts and, respectively, the amplified first and second cancellation input signal parts. Thereby, the amplified first and second transmit input signal parts are combined such that they constructively form the transmit signal 102 at the second port 110 and destructively cancel each other at the third port 112. To the contrary, the amplified first and second cancellation input signal parts are combined such that they constructively form the cancellation signal 111 at the third port 112 and destructively cancel each other at the second port 110. In this way, the transmit signal 102 is generated from the transmit input signal 106 and is output only at the second port 110 to the antenna 200. Further, also in this way, the cancellation signal 111 is generated from the cancellation input signal 108 and is output only at the third port 112 to the signal processing section (here including an LNA 201).

The second coupler 205 is further configured to divide the receive signal 103 into a first part and a second part, with a phase difference of 90° between the first part and the second part, and to provide the first receive signal part to the first signal path, particularly to the first amplifier 204a, and the second receive signal part to the second signal path, particularly to the second amplifier 204b. Both amplifiers 204a and 204b are preferably highly reflective at their outputs, i.e. have a high output reflection coefficient. Accordingly, the first amplifier 204a is configured to reflect the first receive signal part and the second amplifier 204b is configured to reflect the second receive signal part. In particular, said parts are reflected back to the second coupler 205. The second coupler 205 is then configured to combine the reflected first and second receive signal parts such that they constructively form the receive signal 103 at the third port 112 and destructively cancel each other at the second port 110. In this way, the receive signal 103 is provided from the second port 110 to the third port 112.

In case the transmit signal 102 is partly reflected from the antenna 200, this reflection 202 is received again at the antenna port 101 and accordingly at the second port 110. In the same way as described above for the receive signal 103, the reflected transmit signal 202 is provided to the third port 112, i.e. it causes transmit signal leakage. However, the cancellation input signal 108 can be selected such that it cancels the leaked reflected transmit signal 202 at the third port 112. The same is true for any other transmit signal leakage that occurs in the RF front end 100, i.e. the cancellation input signal 108 can be selected such that it cancels any signal leakage caused at the third port 112. Thus, the QBPA by generating the cancellation signal 111 provides a TX SIC mechanism to cancel any TX interference.

Figure 3:
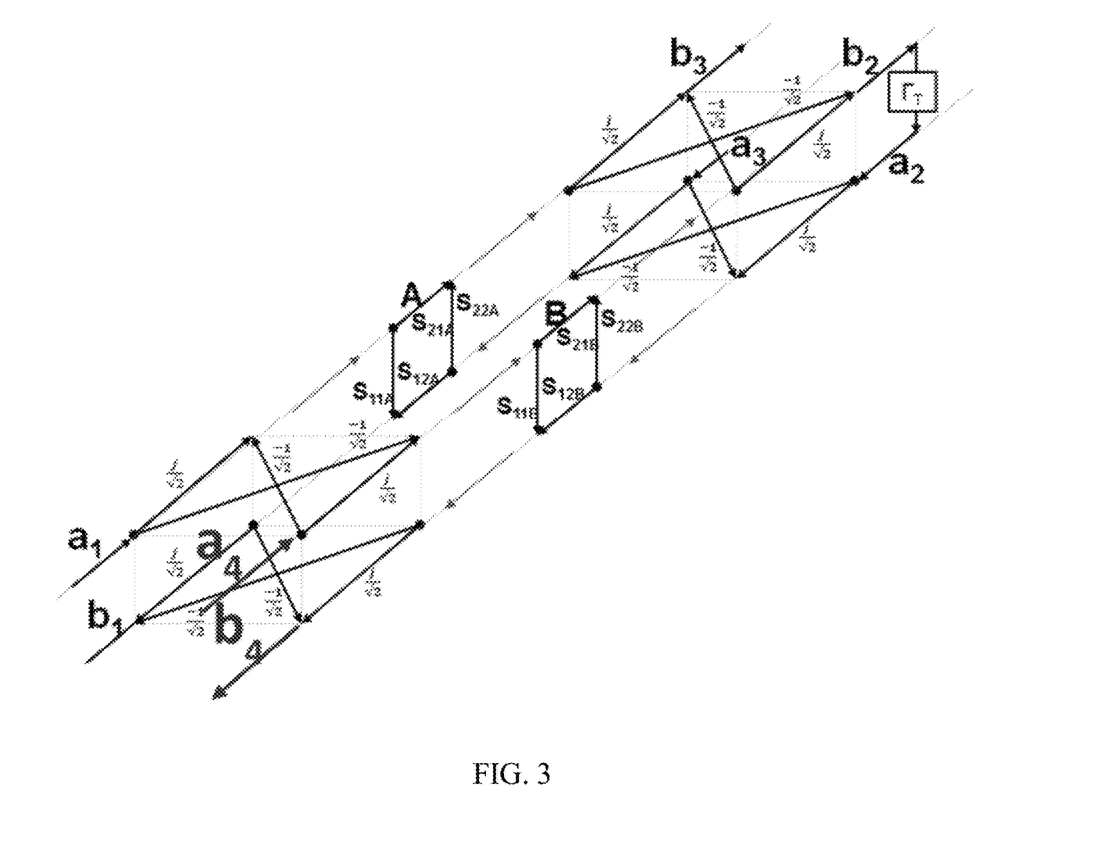
FIG. 3 shows an S-parameter signal flow diagram of a QBPA of an RF front end according to an embodiment of the disclosure.

FIG. 3 illustrates the RF front end 100 of FIG. 2 by a linear S-parameter model and analysis of its QBPA 105. Since many transceivers are linearly operated, it is useful to look at this S-parameter model of the proposed RF front end 100 according to an embodiment of the disclosure. FIG. 3 suggests a simplified S-parameter signal flow diagram.

According to 'D. Regev et al. "*Modified re-configurable quadrature balanced power amplifiers for half and full duplex RE front ends*" 2018 Texas Symposium on Wireless and Microwave Circuits and Systems (WMCS), Waco, T X, 2018, pp. 1-4.', it can be shown that the transmit gain from the first port 107 to the second port 110, denoted $S_{21\ RFFE}$, equals:

$$S_{21\ RFFE} = \frac{b_2}{a_1} = -\frac{j}{2}(S_{21A} + S_{21B}), \quad (1)$$

and that the receive gain from the second port 110 to the third port 112, denoted $S_{32\ RFFE}$, equals:

$$S_{32\ RFFE} = \frac{b_3}{a_2} = -\frac{j}{2}(S_{22A} + S_{22B}). \quad (2)$$

Similarly, by symmetry, the gain for the cancellation signal from the fourth port 109 into the third port 112, denoted $S_{34\ RFFE}$, can be written as:

$$S_{34\ RFFE} = \frac{b_3}{a_4} = -\frac{j}{2}(S_{21A} + S_{21B}). \quad (3)$$

For the reflection coefficient of the antenna 200, denoted $\sigma_T \neq 0$, the gain from the first port 108 to the third port 112, denoted as $S_{31\ RFFE}$, i.e. the transmit signal leakage, for identical (balanced) and highly reflective internal amplifiers 204a and 204b, may be approximated by:

$$S_{31\ RFFE} \approx \Gamma_T |S_{21\ RFFE}| \quad (4)$$

The result in (4) indicates that transmit receive isolation for a balanced QBPA RF front end (as e.g. shown in FIG. 7) will be dominated by the antenna reflection. This is very similar to the performance of the circuit with the circulator shown in FIG. 6B, which will also be mostly dominated by the antenna reflection in practical setups.

As shown previously, one can solve $S_{31RFFE}=0$ for $T_T \#0$ and find a solution to increase T/R isolation. However, a more useful simplification and design target is to keep $S_{22A}=S_{22B}=S_{22}$ and solve instead:

$$\frac{S_{21A} - S_{21B}}{S_{21A} + S_{21B}} = -\Gamma_T S_{22}. \quad (5)$$

Examining the above equation (5) can reveal a "general solution":

$$S_{21\ A}=(1-\Gamma_T S_{22})S_{21}, \text{ and}$$

$$S_{21\ B}=(1+\Gamma_T S_{22})S_{21}. \quad (6)$$

Hence, $S_{31RFFE}$ can be minimized or completely canceled by finding the factor $\Gamma_T S_{22}$ and setting the A and B gains as found in Eq. (6).

Alternatively, as proposed by the present disclosure, the two gains can be kept equal at:

$$S_{21\ A}=S_{21\ B}=S_{21}.$$

That means, that the first signal path is equal to the second signal path and/or means that the amplification of the first parts by the amplifier 204a is equal to the amplification of the second parts by the amplifier 204b in the RF front end 100 of FIG. 2.

Additionally, the cancellation input signal 108 is injected into the fourth port 109, particularly the cancellation input signal $\Gamma_T S_{22}/S_{21}$ is injected at the fourth port 109. This will generate signals identical to those generated by the above equation (6). The main advantage of the concept of the present disclosure is that it is (theoretically) not limited in BW, as it e.g. reproduces and cancels the reflected transmit signal 202 in its full BW.

Figure 4:
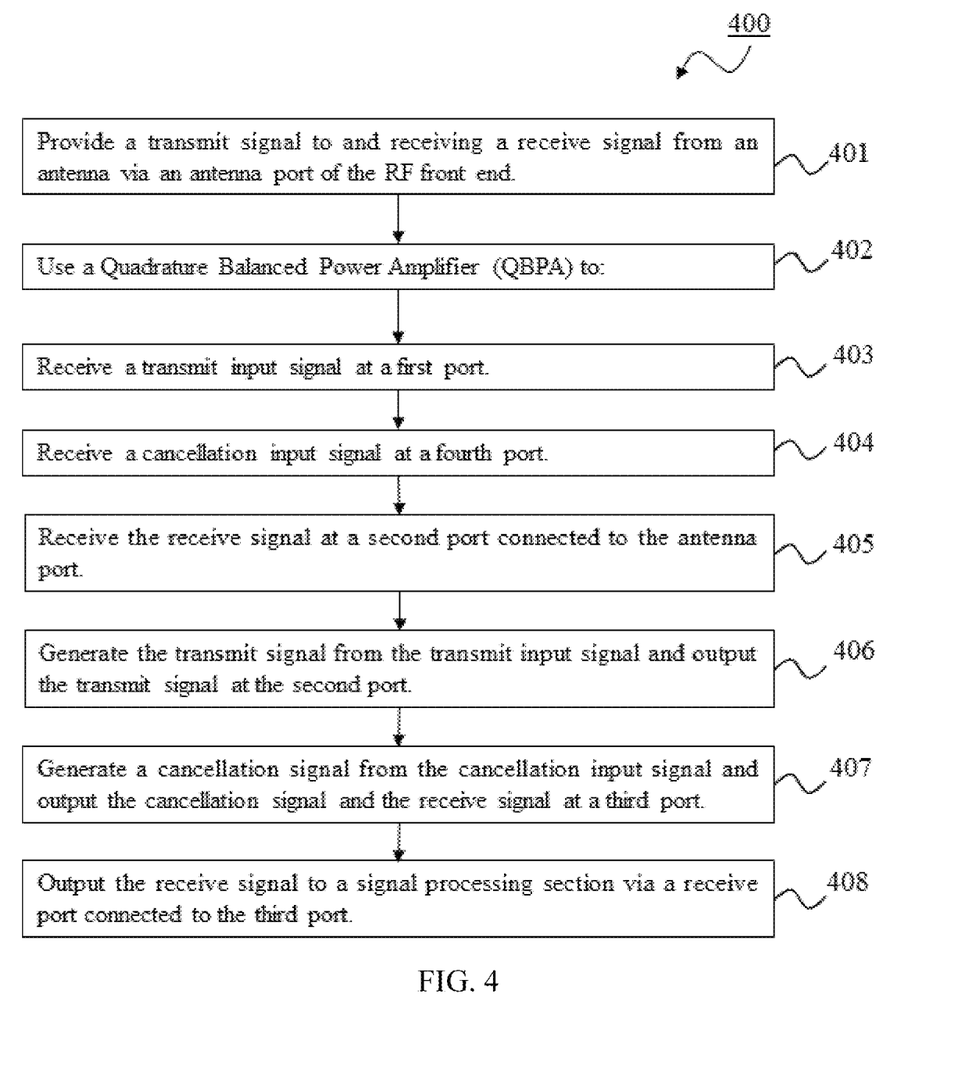
FIG. 4 shows a method according to an embodiment of the disclosure.

FIG. 4 shows a method 400 according to an embodiment of the disclosure. The method 400 is for performing a wireless communication using a RF front end 100, in particular the RF front end 100 shown in FIG. 1 or FIG. 2. The method 400 comprises a step 401 of providing a transmit signal 102 to and receiving a receive signal 103 from an antenna 200 via an antenna port 101 of the RF front end 100. Further, the method 400 comprises a step 402 of using a QBPA 105 to perform a step 403 of receiving a transmit input signal 106 at a first port 107, perform a step 404 of receiving a cancellation input signal 108 at a fourth port 109, perform a step 405 of receiving the receive signal 103 at a second port 110 connected to the antenna port 101, perform a step 406 of generating the transmit signal 102 from the transmit input signal 106 and output 406 the transmit signal 102 at the second port 110, perform a step 407 of generating a cancellation signal 111 from the cancellation input signal 108 and output the cancellation signal 111 and the receive signal 103 at a third port 112. Finally, the method 400 comprises a step 408 of outputting the receive signal 103 to a signal processing section 201 via a receive port 104 connected to the third port 112.

Figure 5:
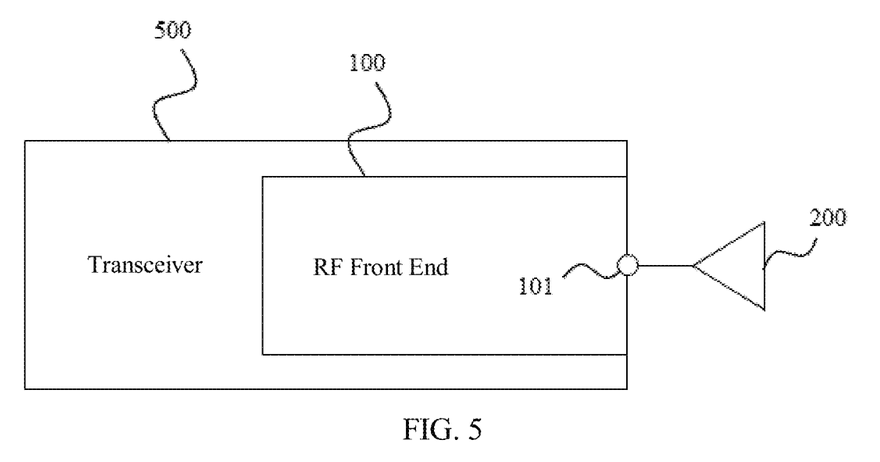
FIG. 5 shows a transceiver (FD or HD) according to an embodiment of the disclosure.

FIG. 5 shows a transceiver 500 (FD or HD) according to an embodiment of the disclosure, which transceiver 500 comprises a RF front end 100 according to an embodiment of the present disclosure, in particular the RF front end 100 of FIG. 1 or FIG. 2. The transceiver 500 further comprises a transmit and receive antenna 200 connected to the antenna port 101 of the RF front end 100. The transceiver 500 may be able to operate in HD and/or FD mode, since the RF front end 100 is a dual mode RF front end, and can further transmit and receive signals via the antenna 200 simultaneously. Due to the use of the RF front end 100, a transmit signal leakage is thereby greatly reduced in the transceiver 500.

The present disclosure has been described in conjunction with various embodiments as examples as well as implementations. However, other variations can be understood and effected by those persons skilled in the art and practicing the claimed disclosure, from the studies of the drawings, this disclosure and the independent claims. In the claims as well as in the description the word "comprising" does not exclude other elements or steps and the indefinite article "a" or "an" does not exclude a plurality. A single element or other unit may fulfill the functions of several entities or items recited in the claims. The mere fact that certain measures are recited in the mutual different dependent claims does not indicate that a combination of these measures cannot be used in an advantageous implementation.

What is claimed is:

1. A radio frequency (RF) front end comprising:
an antenna port configured to:
output a transmit signal to an antenna; and
receive a receive signal from the antenna;
a receive port coupled to the antenna port and configured to output the receive signal to a signal processing section; and
a quadrature balanced power amplifier (QBPA) coupled to the antenna port and the receive port and comprising:
a first port;
a second port coupled to the antenna port;
a third port coupled to the receive port; and
a fourth port,
wherein the QBPA is configured to:
receive a transmit input signal at the first port;
receive a cancellation input signal at the fourth port;
receive the receive signal at the second port;
generate the transmit signal from the transmit input signal;
output the transmit signal at the second port;
generate a cancellation signal from the cancellation input signal; and
output the cancellation signal and the receive signal at the third port.

2. The RF front end of claim 1, wherein the cancellation signal cancels a reflection leakage signal caused at the third port by a reflection in part of the transmit signal.

3. The RF front end of claim 1, wherein the QBPA is further configured to:
amplify a first part of the transmit input signal to form an amplified first part of the transmit input signal in a first signal path;
amplify a first part of the cancellation input signal to form an amplified first part of the cancellation input signal in the first signal path;
amplify a second part of the transmit input signal to form an amplified second part of the transmit input signal in a second signal path;
amplify a second part of the cancellation input signal to form an amplified second part of the cancellation input signal in the second signal path;
generate the transmit signal from the first part of the transmit input signal and the second part of the transmit input signal; and
generate the cancellation signal from the first part of the cancellation input signal and the second part of the cancellation input signal.

4. The RF front end of claim 3, wherein the first signal path is equal to the second signal path, and wherein a first amplification of the first part of the transmit input signal and the first part of the cancellation input signal is equal to a second amplification of the second part of the transmit input signal and the second part of the cancellation input signal.

5. The RF front end of claim 3, wherein the first signal path is equal to the second signal path.

6. The RF front end of claim 3, wherein a first amplification of the first part of the transmit input signal and the first part of the cancellation input signal is equal to a second amplification of the second part of the transmit input signal and the second part of the cancellation input signal.

7. The RF front end of claim 3, wherein the QBPA further comprises:
a first amplifier arranged in the first signal path and configured to amplify the first part of the transmit input signal and the first part of the cancellation input signal; and
a second amplifier arranged in the second signal path and configured to amplify the second part of the transmit input signal and the second part of the cancellation input signal.

8. The RF front end of claim 7, wherein the first amplifier and the second amplifier are configured to have a high output reflection coefficient.

9. The RF front end of claim 3, wherein the QBPA further comprises a second coupler configured to combine the amplified first part of the transmit input signal and the amplified second part of the transmit input signal to constructively form the transmit signal at the second port and to destructively cancel each other at the third port.

10. The RF front end of claim 9, wherein the second coupler is further configured to combine the amplified first part of the cancellation input signal and the amplified second part of the cancellation input signal to constructively form the cancellation signal at the third port and to destructively cancel each other at the second port.

11. The RF front end of claim 9, wherein the second coupler is further configured to:
divide the receive signal into a first part of the receive signal and a second part of the receive signal, wherein a third phase difference between the first part of the receive signal and the second part of the receive signal is 90°; and
provide the first part of the receive signal to the first signal path and the second part of the receive signal to the second signal path.

12. The RF front end of claim 11, wherein the QBPA further comprises:
a first amplifier configured to reflect the first part of the receive signal as a first reflected part of the receive signal; and
a second amplifier configured to reflect the second part of the receive signal as a second reflected part of the receive signal.

13. The RF front end of claim 12, wherein the second coupler is further configured to combine the first reflected part of the receive signal and the second reflected part of the receive signal to constructively form the receive signal at the third port and to destructively cancel each other at the second port.

14. The RF front end of claim 3, wherein the QBPA further comprises a first coupler configured to:
divide the transmit input signal into the first part of the transmit input signal and the second part of the transmit input signal; and
divide the cancellation input signal into the first part of the cancellation input signal and the second part of the cancellation input signal,
wherein a first phase difference between the first part of the transmit input signal and the second part of the transmit input signal is 90°, and
wherein a second phase difference between the first part of the cancellation input signal and the second part of the cancellation input signal is 90°.

15. The RF front end of claim 14, wherein the first coupler is a hybrid coupler and is integrated on a substrate.

16. The RF front end of claim 14, wherein the first coupler is a hybrid coupler and is integrated on a semiconductor chip.

17. The RF front end of claim 14, wherein the first coupler is a hybrid coupler.

18. The RF front end of claim 14, wherein the first coupler is integrated on a substrate or a semiconductor chip.

19. A transceiver comprising:
a transmit and receive antenna; and
a radio frequency (RF) front end in communication with the transmit and receive antenna and comprising:
an antenna port configured to:
output a transmit signal to the transmit and receive antenna; and
receive a receive signal from the transmit and receive antenna;
a receive port coupled to the antenna port and configured to output the receive signal to a signal processing section; and
a quadrature balanced power amplifier (QBPA) coupled to the antenna port and the receive port and comprising:
a first port;
a second port coupled to the antenna port;
a third port coupled to the receive port; and
a fourth port,
wherein the QBPA is configured to:
receive a transmit input signal at the first port;
receive a cancellation input signal at the fourth port;
receive the receive signal at the second port;
generate the transmit signal from the transmit input signal;
output the transmit signal at the second port;
generate a cancellation signal from the cancellation input signal; and
output the cancellation signal and the receive signal at the third port.

20. A method for performing wireless communication using a radio frequency (RF) front end, the method comprising:
providing, using an antenna port of the RF front end, a transmit signal to an antenna;
receiving, from the antenna using the antenna port, a receive signal;
receiving, using a quadrature balanced power amplifier (QBPA), a transmit input signal at a first port of the QBPA;
receiving, using the QBPA, a cancellation input signal at a fourth port of the QBPA;
receiving, using the QBPA, the receive signal at a second port of the QBPA coupled to the antenna port;
generating, using the QBPA, the transmit signal from the transmit input signal;
outputting, using the QBPA, the transmit signal at the second port;
generating, using the QBPA, a cancellation signal from the cancellation input signal;
outputting, using the QBPA, the cancellation signal and the receive signal at a third port of the QBPA; and
outputting, using the QBPA, the receive signal to a signal processing section using a receive port coupled to the third port.

* * * * *